(12) United States Patent
Chang et al.

(10) Patent No.: US 8,507,085 B2
(45) Date of Patent: Aug. 13, 2013

(54) ANTI-CORROSION TREATMENT PROCESS FOR ALUMINUM OR ALUMINUM ALLOY AND ALUMINUM OR ALUMINUM ALLOY ARTICLE THEREOF

(75) Inventors: Hsin-Pei Chang, New Taipei (TW);
Wen-Rong Chen, New Taipei (TW);
Huann-Wu Chiang, New Taipei (TW);
Cheng-Shi Chen, New Taipei (TW);
Cong Li, Shenzhen (CN)

(73) Assignees: Hong Fu Jin Precision Industry (ShenZhen) Co., Ltd., Shenzhen (CN);
Hon Hai Precision Industry Co., Ltd., New Taipei (TW)

( * ) Notice: Subject to any disclaimer, the term of this patent is extended or adjusted under 35 U.S.C. 154(b) by 184 days.

(21) Appl. No.: 13/176,311

(22) Filed: Jul. 5, 2011

(65) Prior Publication Data

US 2012/0276406 A1    Nov. 1, 2012

(30) Foreign Application Priority Data

Apr. 28, 2011 (CN) .......................... 2011 1 0107934

(51) Int. Cl.
*B32B 9/00* (2006.01)
*C23C 14/00* (2006.01)

(52) U.S. Cl.
USPC ................... 428/336; 204/192.1; 204/192.15; 427/327; 427/419.1; 427/419.2; 427/419.7; 428/469; 428/472; 428/698; 428/701; 428/702

(58) Field of Classification Search
USPC .............. 204/192.1, 192.15; 427/327, 419.1, 427/419.2, 419.7; 428/336, 469, 472, 698, 428/701, 702
See application file for complete search history.

(56) References Cited

U.S. PATENT DOCUMENTS 6,770,923 B2 * 8/2004 Nguyen et al. ................ 257/295
7,808,168 B2 * 10/2010 Kuroda et al. ................ 428/323

FOREIGN PATENT DOCUMENTS

EP         0 784 101         *   7/1997

* cited by examiner

*Primary Examiner* — Archene Turner
(74) *Attorney, Agent, or Firm* — Altis Law Group, Inc.

(57) ABSTRACT

An aluminum or aluminum alloy article is described. The aluminum or aluminum alloy article includes an aluminum or aluminum alloy substrate, a barrier layer formed on the substrate, a color layer formed on the barrier layer, and an insulation layer formed on the color layer. The barrier layer and the color layer are formed by vacuum sputtering. The barrier layer is a layer of silver-aluminum-oxygen-nitrogen. The insulation layer is an external layer of the aluminum or aluminum alloy article.

20 Claims, 2 Drawing Sheets

ANTI-CORROSION TREATMENT PROCESS FOR ALUMINUM OR ALUMINUM ALLOY AND ALUMINUM OR ALUMINUM ALLOY ARTICLE THEREOF

CROSS-REFERENCE TO RELATED APPLICATIONS

This application is one of the three related co-pending U.S. patent applications listed below. All listed applications have the same assignee. The disclosure of each of the listed applications is incorporated by reference into the other listed applications.

| Attorney Docket No. | Title | Inventors |
| --- | --- | --- |
| US 35689 | ANTI-CORROSION TREATMENT PROCESS FOR ALUMINUM OR ALUMINUM ALLOY AND ALUMINUM OR ALUMINUM ALLOY ARTICLE THEREOF | HSIN-PEI CHANG et al. |
| US 35696 | ANTI-CORROSION TREATMENT PROCESS FOR ALUMINUM OR ALUMINUM ALLOY AND ALUMINUM OR ALUMINUM ALLOY ARTICLE THEREOF | HSIN-PEI CHANG et al. |
| US 38618 | ANTI-CORROSION TREATMENT PROCESS FOR ALUMINUM OR ALUMINUM ALLOY AND ALUMINUM OR ALUMINUM ALLOY ARTICLE THEREOF | HSIN-PEI CHANG et al. |

BACKGROUND

1. Technical Field

The present disclosure relates to an anti-corrosion treatment process for aluminum or aluminum alloy and aluminum or aluminum alloy article thereof.

2. Description of Related Art

Aluminum or aluminum alloy is widely used for its excellent properties. However, the aluminum or aluminum alloy is prone to corrosion because the aluminum or aluminum alloy has a very low standard electrode potential. To protect the aluminum or aluminum alloy from corrosion, an insulation layer may be formed between the aluminum or aluminum alloy and a vacuum deposited protective layer for the purpose of preventing a galvanic corrosion from forming in the layers and the aluminum or aluminum alloy. However, since the layers almost always have pinholes and cracks formed therein, the corrosives can permeate the layers and create a galvanic cell in the protective layer and the aluminum or aluminum alloy. The protective layer may become a cathode of the galvanic cell and the aluminum or aluminum alloy may become an anode of the galvanic cell. For a surface area of the cathode that larger than the surface area of the anode (small portion surface of the aluminum or aluminum alloy), a large corrosion current of the galvanic cell will be created in the protective layer and the aluminum or aluminum alloy. As such, the protective layer and the aluminum or aluminum alloy are quickly corroded.

Therefore, there is room for improvement within the art.

BRIEF DESCRIPTION OF THE FIGURES

Many aspects of the disclosure can be better understood with reference to the following figures. The components in the figures are not necessarily drawn to scale, the emphasis instead being placed upon clearly illustrating the principles of the disclosure. Moreover, in the drawings like reference numerals designate corresponding parts throughout the several views.

DETAILED DESCRIPTION

Figure 1:
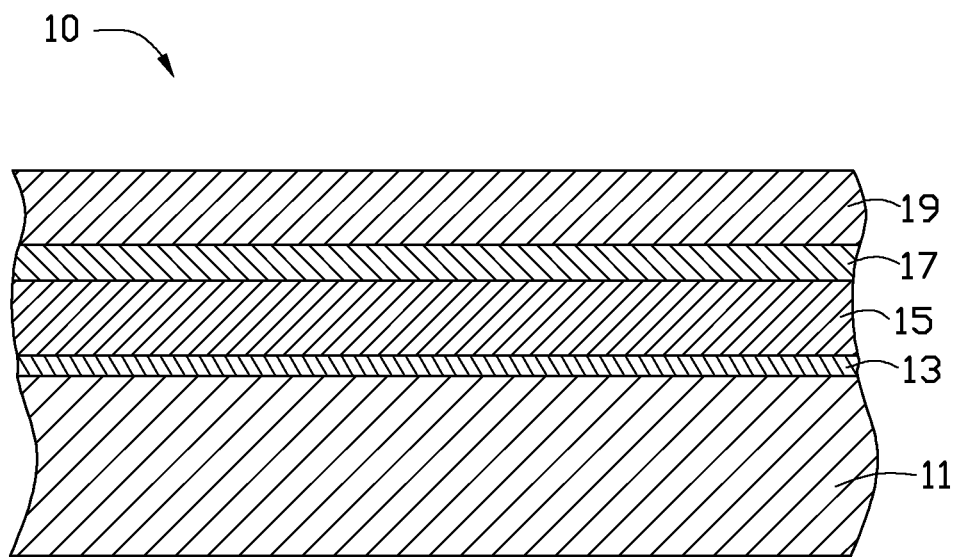
FIG. 1 is a cross-sectional view of an exemplary embodiment of an aluminum or aluminum alloy article.

According to an exemplary embodiment, an anti-corrosion treatment process for aluminum or aluminum alloy may include the following steps:

Referring to FIG. 1, an aluminum or aluminum alloy substrate 11 is provided. The substrate 11 is then pre-treated, such a pre-treating process may include the following steps:

The substrate 11 is cleaned in an ultrasonic cleaning device (not shown) filled with ethanol or acetone.

Figure 2:
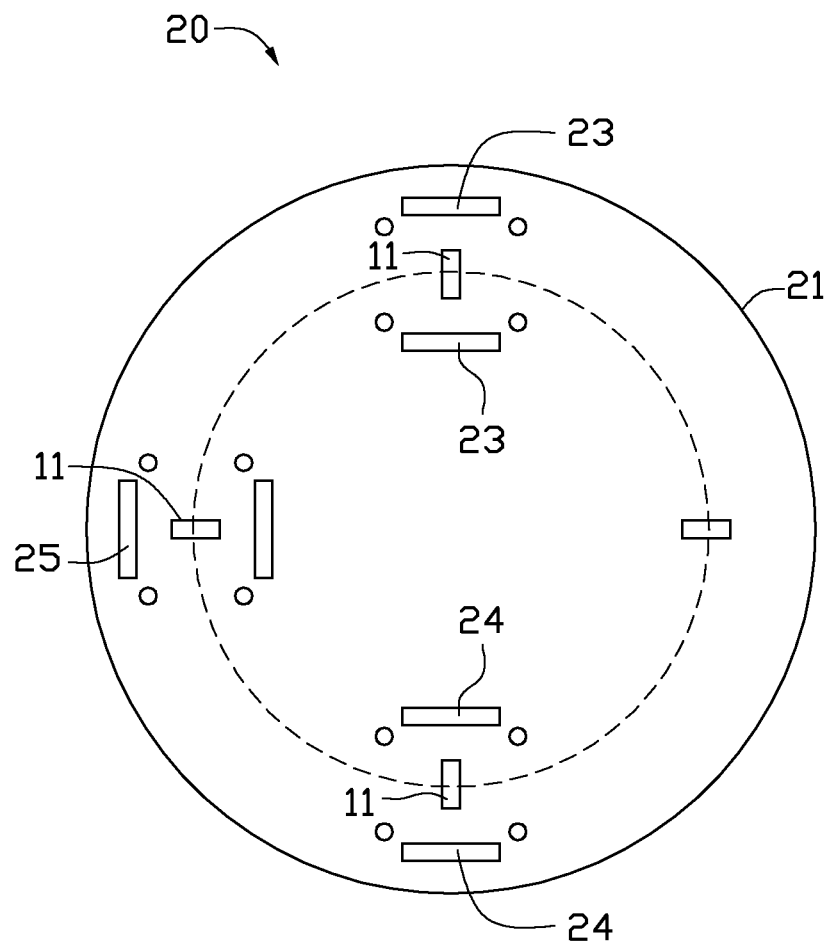
FIG. 2 is an overlook view of an exemplary embodiment of a vacuum sputtering device.

The substrate 11 is plasma cleaned. Referring to FIG. 2, the substrate 11 may be positioned in a coating chamber 21 of a vacuum sputtering device 20. Silver-aluminum alloy targets 23, chromium targets 24, and silicon targets 25 are fixed in the coating chamber 21. The silver within the silver-aluminum alloy target 23 may have a mass percentage of about 10%-25%.

The coating chamber 21 is then evacuated to about $8.0 \times 10^{-3}$ Pa. Argon gas having a purity of about 99.999% may be used as a working gas and is injected into the coating chamber 21 at a flow rate of about 500 standard-state cubic centimeters per minute (sccm). The substrate 11 have a negative bias voltage of about $-500$ V to about $-800$ V, then high-frequency voltage is produced in the coating chamber 21 and the argon gas is ionized to plasma. The plasma then strikes the surface of the substrate 11 to clean the surface of the substrate 11. Plasma cleaning of the substrate 11 may take about 5 minutes (min) to 10 min. The plasma cleaning process enhances the bond between the substrate 11 and the subsequent layers. The targets are unaffected by the pre-cleaning process.

A combining layer 13 may be magnetron sputtered on the pretreated substrate 11 by using the silver-aluminum alloy targets 23. Magnetron sputtering of the combining layer 13 is implemented in the coating chamber 21. The inside of the coating chamber 21 may be heated to about 100° C.-200° C. Argon gas may be used as a working gas and is injected into the coating chamber 21 at a flow rate of about 100 sccm-300 sccm. A power of 2 kilowatt (KW)-8 KW is applied to the silver-aluminum alloy targets 23, then aluminum and silver atoms are sputtered off from the silver-aluminum alloy targets 23 to deposit the combining layer 13 on the substrate 11. During the depositing process, the substrate 11 may have a negative bias voltage of about $-50$ V to about $-300$ V. Depositing of the combining layer 13 may take about 5 min-10 min.

The combining layer 13 is a compound silver-aluminum (Ag—Al) layer. The thickness of the combining layer 13 may be about 100 nm-200 nm. The combining layer 13 enhances the bond between the substrate 11 and the subsequent deposited layers.

A barrier layer 15 may be magnetron sputtered on the combining layer 13 by using the silver-aluminum targets 23. Magnetron sputtering of the barrier layer 15 is implemented in the coating chamber 21. The internal temperature of the coating chamber 21 may be about 100° C.-200° C. Nitrogen ($N_2$) and oxygen ($O_2$) may be used as reaction gases and are injected into the coating chamber 21 all at a flow rate of about 10 sccm-20 sccm, and argon gas may be used as a working gas and is injected into the coating chamber 21 at a flow rate of about 100 sccm-300 sccm. The power of 2 kilowatt (KW)-8

KW is applied to the silver-aluminum targets 23, then silver and aluminum atoms are sputtered off from the silver-aluminum targets 23. The silver atoms, aluminum atoms, nitrogen and oxygen atoms are then ionized in an electrical field in the coating chamber 21 and chemically react to deposit the barrier layer 15 on the combining layer 13. The ionized aluminum chemically reacts with the ionized nitrogen and oxygen and forms aluminum-oxygen-nitrogen phase (AlON) in the barrier layer 15, and the ionized silver mainly ionic bond with the oxygen and nitrogen. During the depositing process, the substrate 11 may have a negative bias voltage of about −50 V to about −300 V. Depositing of the barrier layer 15 may take about 30 min-120 min.

The barrier layer 15 is a layer of silver-chromium-oxygen-nitrogen (Ag—AlON). The barrier layer 15 has Al—O crystalline grains and Al—N crystalline grains formed therein. The thickness of the barrier layer 15 may be about 500 nm-700 nm.

During the depositing of the barrier layer 15, Al—O and Al—N crystalline grains will form simultaneously. Each kind of crystalline grains inhibit the growth of the other kind of crystalline grains, as such, the size of the crystalline grains is reduced, which provides the barrier layer 15 a high density. Furthermore, silver ions within the barrier layer 15 are prone to ionization in corrosives and chemically react with chlorine ions which contained in the corrosives to form silver chloride and fill some of the pinholes or cracks formed in the barrier layer 15, which further improves the density of the barrier layer 15.

A color layer 17 may be magnetron sputtered on the barrier layer 15 by using the chromium targets 24. Magnetron sputtering of the color layer 17 is implemented in the coating chamber 21. The internal temperature of the coating chamber 21 may be of about 50° C.-150° C. Nitrogen ($N_2$) may be used as a reaction gas and is injected into the coating chamber 21 at a flow rate of about 10 sccm-120 sccm, and argon gas may be used as a working gas and is injected into the coating chamber 21 at a flow rate of about 100 sccm-200 sccm. A power of 5 kilowatt (KW)-10 KW is applied to the chromium targets 24, and chromium atoms are sputtered off from the chromium targets 24. The chromium atoms and nitrogen atoms are then ionized in an electrical field in the coating chamber 21. The ionized chromium then chemically reacts with the ionized nitrogen to deposit the color layer 17 of chromium nitride (CrN) on the barrier layer 15. During the depositing process, the substrate 11 may have a negative bias voltage of about −100 V to about −300 V. Depositing of the color layer 17 may take about 15 min-50 min.

The color layer 17 is a layer of chromium nitride (CrN). The color layer 17 has a thickness of about 300 nm-500 nm.

An insulation layer 19 may be sputtered on the color layer 17 by using the silicon targets 25. Sputtering of the insulation layer 19 is implemented in the coating chamber 21. The internal temperature of the coating chamber 21 may be of about 150° C.-200° C. Oxygen ($O_2$) may be used as a reaction gas and is injected into the coating chamber 21 at a flow rate of about 10 sccm-20 sccm, and argon gas may be used as a working gas and is injected into the coating chamber 21 at a flow rate of about 100 sccm-300 sccm. A power of 2 kilowatt (KW)-8 KW is applied to the silicon targets 25, and silicon atoms are sputtered off from the silicon targets 25. The silicon and oxygen atoms are then ionized in an electrical field in the coating chamber 21. The ionized silicon then chemically reacts with the ionized oxygen to deposit the insulation layer 19 on the color layer 17. During the depositing process, the substrate 11 may have a negative bias voltage of about −50 V to about −300 V. Depositing of the insulation layer 19 may take about 30 min-50 min.

The insulation layer 19 is a transparent layer of silicon dioxide ($SiO_2$). The insulation layer 19 has a thickness of about 800 nm-1000 nm.

The barrier layer 15 and the insulation layer 19 can also be formed by arc ion plating or evaporation deposition.

The color layer 17 can also be a layer of titanium-carbon-nitrogen (TiCN), titanium nitride (TiN), chromium-carbon-nitrogen (CrCN), or any other decorative layers formed by vacuum sputtering or arc ion plating.

The insulation layer 19 can also be a layer of aluminum oxide formed by vacuum sputtering, arc ion plating, or evaporation deposition, a layer of polytetrafluoroethylene formed by chemical vacuum deposition or spraying, or a layer of insulative paint or insulative ink formed by spraying or printing.

FIG. 1 shows an aluminum or aluminum alloy article 10 formed by the exemplary method. The aluminum or aluminum alloy article 10 includes the aluminum or aluminum alloy substrate 11, the combining layer 13 formed on a surface of the substrate 11, the barrier layer 15 formed on the combining layer 13, the color layer 17 formed on the barrier layer 15, and the insulation layer 19 formed on the color layer 17.

In the exemplary embodiment, the insulation layer 19 is the outermost layer. The insulation layer 19 blocks most corrosives, so only a small amount of the corrosives may enter through the pinholes or cracks that may have been formed in the color layer 17 and transit to a small portion surface of the substrate 11. Thus even if a galvanic cell is created in the color layer 17 and the substrate 11, the color layer 17, namely the cathode, has a very small surface area and may be proportional to the anode surface area (the small portion surface of the substrate 11), then the corrosion current of the galvanic cell is very small and the corroding of the color layer 17 and the substrate 11 is greatly reduced. Moreover, the barrier layer 15 has a high density to further block the corrosives from transiting to the substrate 11 and reduces the concentration of the corrosives arrived at the substrate 11, which further reduces the corroding in the aluminum or aluminum alloy article 10. As such, the excellent corrosion resistance property of the aluminum or aluminum alloy article 10 is achieved.

Additionally, the insulation layer 19 is transparent, which will not affect the decoration of the color layer 17 for the aluminum or aluminum alloy article 10.

It is to be understood that, the insulation layer 19 can also be opaque if a decorative appearance is not requested.

The anti-corrosion treatment process in the exemplary embodiment can also be used to treat magnesium or magnesium alloy substrate.

It is believed that the exemplary embodiment and its advantages will be understood from the foregoing description, and it will be apparent that various changes may be made thereto without departing from the spirit and scope of the disclosure or sacrificing all of its advantages, the examples hereinbefore described merely being preferred or exemplary embodiment of the disclosure.

What is claimed is:
1. An aluminum or aluminum alloy article, comprising:
 an aluminum or aluminum alloy substrate;
 a barrier layer formed on the substrate by vacuum sputtering, the barrier layer being a layer of silver-aluminum-oxygen-nitrogen;
 a color layer formed on the barrier layer by vacuum sputtering; and an insulation layer formed on the color layer, the insulation layer being an external layer of the aluminum or aluminum alloy article.

2. The aluminum or aluminum alloy article as claimed in claim 1, wherein the barrier layer has a thickness of about 500 nm-700 nm.

3. The aluminum or aluminum alloy article as claimed in claim 1, wherein the color layer is a layer of chromium nitride and has a thickness of about 300 nm-500 nm.

4. The aluminum or aluminum alloy article as claimed in claim 1, wherein the color layer is a layer of titanium-carbon-nitrogen, titanium nitride, or chromium-carbon-nitrogen formed by vacuum sputtering or arc ion plating.

5. The aluminum or aluminum alloy article as claimed in claim 1, wherein the insulation layer is a silicon dioxide layer or aluminum oxide layer formed by vacuum sputtering, arc ion plating, or evaporation deposition.

6. The aluminum or aluminum alloy article as claimed in claim 5, wherein the silicon dioxide layer has a thickness of about 800 nm-1000 nm.

7. The aluminum or aluminum alloy article as claimed in claim 1, wherein the insulation layer is a layer of polytetrafluoroethylene formed by chemical vacuum deposition or spraying.

8. The aluminum or aluminum alloy article as claimed in claim 1, wherein the insulation layer is a layer of insulative paint or insulative ink formed by spraying or printing.

9. The aluminum or aluminum alloy article as claimed in claim 1, further comprising a combining layer formed between the substrate and the barrier layer, the combining layer is a silver-aluminum layer.

10. An anti-corrosion treatment process for aluminum or aluminum alloy, comprising:
   providing an aluminum or aluminum alloy substrate;
   forming a barrier layer on the substrate by vacuum sputtering, using silver-aluminum alloy target, using nitrogen and oxygen as reaction gases; the barrier layer being a layer of silver-aluminum-oxygen-nitrogen;
   forming a color layer on the barrier layer by vacuum sputtering; and
   forming an insulation layer on the color layer, the insulation layer being an external layer.

11. The process as claimed in claim 10, wherein forming the barrier layer is by using a magnetron sputtering process, the silver-aluminum alloy target is applied with a power of about 2 KW-8 KW; the nitrogen and the oxygen all have a flow rate of about 10 sccm-20 sccm; uses argon as a working gas, the argon has a flow rate of about 100 sccm-300 sccm; magnetron sputtering of the barrier layer is conducted at a temperature of about 100° C.-200° C. and takes about 30 min-120 min.

12. The process as claimed in claim 11, wherein the substrate has a negative bias voltage of about −50V to about −300V during sputtering the barrier layer.

13. The process as claimed in claim 10, wherein the color layer is a layer of chromium nitride, forming the color layer is by using a magnetron sputtering process, uses chromium target, the target is applied with a power of about 5 KW-10 KW; uses nitrogen as a reaction gas, the nitrogen has a flow rate of about 10 sccm-120 sccm; uses argon as a working gas, the argon has a flow rate of about 100 sccm-200 sccm; magnetron sputtering of the color layer is conducted at a temperature of about 50° C.-150° C. and takes about 15 min-50 min.

14. The process as claimed in claim 13, wherein the substrate has a negative bias voltage of about −100V to about −300V during sputtering the color layer.

15. The process as claimed in claim 10, wherein the color layer is a layer of titanium-carbon-nitrogen, titanium nitride, or chromium-carbon-nitrogen formed by vacuum sputtering or arc ion plating.

16. The process as claimed in claim 10, wherein the insulation layer is a layer of silicon dioxide, forming the silicon dioxide is by using a vacuum sputtering process, uses silicon target, the target is applied with a power of about 2 KW-8 KW; uses oxygen as a reaction gas, the oxygen has a flow rate of about 10 sccm-20 sccm; uses argon as a working gas, the argon has a flow rate of about 100 sccm-300 sccm; vacuum sputtering of the silicon dioxide is conducted at a temperature of about 150° C.-200° C. and takes about 30 min-50 min.

17. The process as claimed in claim 16, wherein the substrate has a negative bias voltage of about −50V to about −300V during sputtering the silicon dioxide.

18. The process as claimed in claim 10, wherein the insulation layer is a layer of aluminum oxide formed by vacuum sputtering, arc ion plating, or evaporation deposition, a layer of polytetrafluoroethylene formed by chemical vacuum deposition or spraying, or a layer of insulative paint or insulative ink formed by spraying or printing.

19. The process as claimed in claim 10, further comprising a step of forming a combining layer on the substrate before forming the barrier layer, the combining layer is a silver-aluminum layer.

20. The process as claimed in claim 19, further comprising a step of ultrasonic cleaning the substrate and then plasma cleaning the substrate before forming the combining layer.

* * * * *